US010969416B2

(12) United States Patent
Pereira et al.

(10) Patent No.: US 10,969,416 B2
(45) Date of Patent: Apr. 6, 2021

(54) SYSTEM AND METHOD OF DUPLICATE CIRCUIT BLOCK SWAPPING FOR NOISE REDUCTION

(71) Applicant: SILICON LABORATORIES INC., Austin, TX (US)

(72) Inventors: Vitor Pereira, Austin, TX (US); Arup Mukherji, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 209 days.

(21) Appl. No.: 16/219,173

(22) Filed: Dec. 13, 2018

(65) Prior Publication Data

US 2020/0191849 A1 Jun. 18, 2020

(51) Int. Cl.
G01R 29/26 (2006.01)
H03B 5/20 (2006.01)
G06F 1/04 (2006.01)

(52) U.S. Cl.
CPC .............. G01R 29/26 (2013.01); G06F 1/04 (2013.01); H03B 5/20 (2013.01)

(58) Field of Classification Search
CPC .. G01R 29/26; G06F 1/04; H03B 5/20; H03K 3/013
See application file for complete search history.

(56) References Cited

U.S. PATENT DOCUMENTS

| 4,771,420 A | 9/1988 | Deschaine et al. |
| 9,823,687 B2 | 11/2017 | Mukherji et al. |
| 2003/0214868 A1* | 11/2003 | Baker ................. G11C 11/1693 365/207 |

OTHER PUBLICATIONS

Hsieh, Kuo-Chiang et al. "A Low-Noise Chopper-Stabilized Differential Switched-Capacitor Filtering Technique." *IEEE Journal of Solid-State Circuits.* vol. SC-!6., No. 6, Dec. 1981. pp. 708-715.
Nys, Olivier et al. "A 19-Bit Low-Power Multibit Sigma-Delta ADS Based on Data Weighted Averaging." *IEEE Journal of Solid-State Circuits,* vol. 32, No. 7. Jul. 1997. pp. 933-942.

* cited by examiner

*Primary Examiner* — Neel D Shah
(74) *Attorney, Agent, or Firm* — Gary Stanford

(57) ABSTRACT

An integrated circuit including at least one circuit node, multiple duplicate circuit blocks integrated on the integrated circuit in close proximity with each other, each including at least one device that is susceptible to random telegraph noise (RTN), and a switch circuit that swaps electrical coupling of the duplicate circuit blocks, one at a time, to the at least one circuit node in sequential cycles of a clock signal. The duplicate circuit blocks may be large functional blocks, such as an oscillator or a comparator or the like, or limited to circuits including RTN susceptible devices, such as differential pairs or the like. Each duplicate circuit block may include any number of connections for coupling to corresponding circuit nodes. The swapping may further include chopping in which multiple inputs are swapped with each other while multiple outputs are swapped with each other in consecutive clock cycles.

20 Claims, 5 Drawing Sheets

SYSTEM AND METHOD OF DUPLICATE CIRCUIT BLOCK SWAPPING FOR NOISE REDUCTION

BACKGROUND OF THE INVENTION

Field of the Invention

The present invention relates in general to electronic circuit noise reduction, and more particularly to a system and method of sequentially replacing or swapping duplicate circuit blocks to reduce Random Telegraph Noise (RTN) or "popcorn" noise in an electronic circuit.

Description of the Related Art

Random Telegraph Noise (RTN) or "popcorn" noise is characterized by sudden voltage or current transitions between two or more discrete levels in semiconductor devices. The characteristics of RTN present a challenge for circuits and applications that operate with relatively long time constants and that require relatively high accuracy. Clock circuits used for keeping time, for example, may suffer from RTN causing improper operation or erroneous results. Audio circuits may also suffer from RTN causing spurious or unwanted audible noise. Semiconductor parts that operate with a relatively large time constant and that fail specifications due to RTN are very difficult to screen at production test since the testing time necessary to detect failure is prohibitively long. Thus, it is not cost effective to screen parts during production test.

SUMMARY OF THE INVENTION

An integrated circuit according to one embodiment includes at least one circuit node, multiple duplicate circuit blocks integrated on the integrated circuit in close proximity with each other, each including at least one device that is susceptible to random telegraph noise (RTN), and a switch circuit that swaps electrical coupling of the duplicate circuit blocks, one at a time, to the at least one circuit node in sequential cycles of a clock signal.

In one embodiment, the at least one circuit node may be a timing node, and the duplicate circuit blocks may be duplicate oscillators providing corresponding timing signals. The switch circuit electrically couples each timing signal, one at a time, to the timing node.

In another embodiment, the at least one circuit node includes a positive input node, a negative input node, and an output node, and the duplicate circuit blocks may be comparators each having a positive comparator input, a negative comparator input, and a comparator output. The switch circuit electrically couples the comparators, one at a time, to the at least one circuit node and when electrically coupled, the switch circuit electrically couples the positive comparator input of the selected comparator to the positive input node, electrically couples the negative comparator input of the selected comparator to the negative input node, and electrically couples the comparator output of the selected comparator to the output node.

In another embodiment, the at least one circuit node includes a positive input node, a negative input node, a positive output node, and a negative output node, and the duplicate circuit blocks are differential pairs each having a first input, a second input, a first output, and a second output. The switch circuit electrically couples the differential pairs, one at a time, to the at least one circuit node, and when electrically coupled, the switch circuit electrically couples the first input of the selected differential pair to the positive input node, electrically couples the second input of the selected differential pair to the negative input node, electrically couples the first output of the selected differential pair to the negative output node, and electrically couples the second output of the selected differential pair to the positive output node. Each differential pair may include a common source node. In addition, the switch circuit may assert a reset signal to electrically couple the first and second inputs of each non-selected differential pair to a common source node of each non-selected differential pair.

In another embodiment, the switch circuit may further perform chopping in two clock cycles. In the first clock cycle, the switch circuit electrically couples the first input of the selected differential pair to the positive input node, electrically couples the second input of the selected differential pair to the negative input node, electrically couples the first output of the selected differential pair to the negative output node, and electrically couples the second output of the selected differential pair to the positive output node. In the second clock cycle, the switch circuit electrically couples the first input of the selected differential pair to the negative input node, electrically couples the second input of the selected differential pair to the positive input node, electrically couples the first output of the selected differential pair to the positive output node, and electrically couples the second output of the selected differential pair to the negative output node.

In another embodiment, the at least one circuit node includes multiple circuit nodes, and each duplicate circuit block includes multiple block nodes. When a circuit block is selected to be electrically coupled, the switch circuit electrically couples each block node of the selected circuit block to a corresponding circuit node.

The duplicate circuit blocks may operate with a relatively long time constant, such as on the order of at least one millisecond or much longer. Time constants on the order of several hundred milliseconds or several seconds or more are contemplated. The at least one circuit node may be part of a clock circuit that is used to generate a time reference.

In another embodiment, the at least one circuit node may include first and second input nodes and first and second output nodes. The duplicate circuit blocks may be symmetrical circuits with first and second input terminals and first and second output terminals such that when electrically coupled, the first and second input terminals are coupled to the first and second input nodes, and the first and second output terminals are coupled to the first and second output nodes. The switch circuit may also perform chopping by swapping coupling of the first and second input terminals and the first and second output terminals.

A method of reducing noise on a semiconductor circuit according to one embodiment includes providing at least one circuit node on the semiconductor circuit, integrating multiple duplicate circuit blocks on the semiconductor circuit in close proximity with each other, each including at least one device that is susceptible to random telegraph noise (RTN), and swapping electrical coupling of the duplicate circuit blocks, one at a time, to the at least one circuit node in sequential cycles of a clock signal.

The method may include providing a timing node, integrating duplicate oscillators to provide multiple timing signals, and electrically coupling each timing signal, one at a time, to the timing node.

The method may include providing a positive input node, a negative input node, and an output node, integrating multiple comparators each having a positive comparator input, a negative comparator input, and a comparator output, and electrically coupling the comparators, one at a time, to the at least one circuit node, such that when a selected comparator is electrically coupled, the swapping includes electrically coupling the positive comparator input of the selected comparator to the positive input node, electrically coupling the negative comparator input of the selected comparator to the negative input node, and electrically coupling the comparator output of the selected comparator to the output node.

The method may include providing a positive input node, a negative input node, and positive output node, and a negative output node, integrating multiple differential pairs each having a first input, a second input, a first output, and a second output, and electrically coupling the differential pairs, one at a time, to the at least one circuit node, such that when a selected differential pair is electrically coupled, the swapping includes electrically coupling the first input of the selected differential pair to the positive input node, electrically coupling the second input of the selected differential pair to the negative input node, electrically coupling the first output of the selected differential pair to the negative output node, and electrically coupling the second output of the selected differential pair to the positive output node.

The method may include integrating a common source node with each duplicate circuit block, and asserting a reset signal to electrically couple the first and second inputs of each non-selected differential pair to a common source node of each non-selected differential pair.

The method may include providing a positive input node, a negative input node, and positive output node, and a negative output node, integrating multiple differential pairs each having a first input, a second input, a first output, and a second output, such that the swapping includes electrically coupling the differential pairs, one at a time, to the at least one circuit node. When a selected differential pair is electrically coupled, the method may further include performing chopping in two clock cycles, including a first clock cycle which includes electrically coupling the first input of the selected differential pair to the positive input node, electrically coupling the second input of the selected differential pair to the negative input node, electrically coupling the first output of the selected differential pair to the negative output node, and electrically coupling the second output of the selected differential pair to the positive output node, and including a second clock cycle which includes electrically coupling the first input of the selected differential pair to the negative input node, electrically coupling the second input of the selected differential pair to the positive input node, electrically coupling the first output of the selected differential pair to the positive output node, and electrically coupling the second output of the selected differential pair to the negative output node.

The method may include providing multiple circuit nodes, integrating multiple block nodes, and when a circuit block is selected to be electrically coupled, electrically coupling each block node of the selected circuit block to a corresponding circuit node.

The method may include configuring each duplicate circuit block to operate with a time constant on the order of at least one millisecond. The method may include configuring at least one circuit node to generate a time reference. The method may include providing first and second input nodes and first and second output nodes, providing symmetrical circuits with first and second input terminals and first and second output terminals such that when electrically coupled, the first and second input terminals are coupled to the first and second input nodes, and the first and second output terminals are coupled to the first and second output nodes. The method may further include chopping by swapping the coupling of the first and second input terminals and the first and second output terminals.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The inventors have recognized the problems associated with RTN and also the difficulty in detecting RTN during production testing. They have therefore developed a system and method of duplicate circuit block swapping to reduce RTN. RTN is reduced without the need to identify the source of RTN causing the performance degradation. Although large functional circuits may be duplicated and swapped out during operation to reduce noise and improve operation, judicious selection of the duplicated circuit block may reduce the area and power penalty associated therewith.

Figure 1:
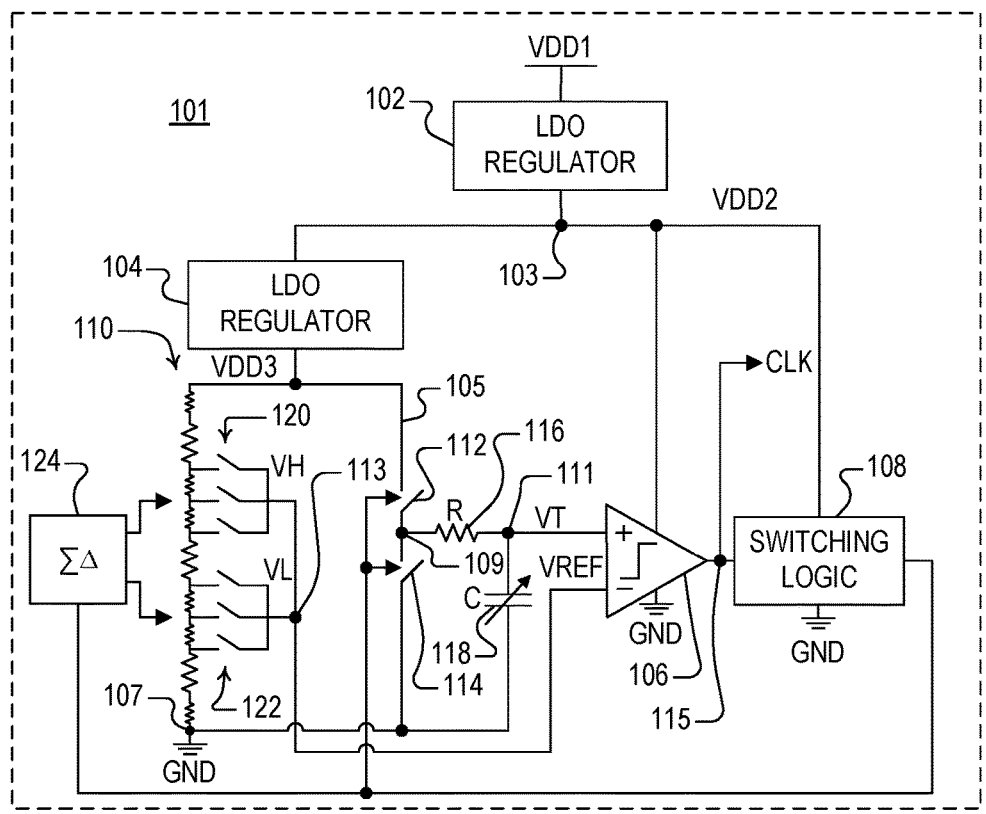
FIG. 1 is a schematic and block diagram of a conventional relaxation oscillator.

FIG. 1 is a schematic and block diagram of a conventional relaxation oscillator 101, such as described in U.S. Pat. No. 9,823,687, entitled "LOW FREQUENCY PRECISION OSCILLATOR," issued Nov. 13, 2017 to Mukherji et al. A first low dropout (LDO) regulator 102 receives a first supply voltage VDD1 and provides a second supply voltage VDD2 on a supply node 103, and a second LDO regulator 104 receives VDD2 and provides a third supply voltage VDD3 on a supply node 105. VDD2 is used to supply power to a comparator 106 and switching logic 108, both referenced to a reference supply voltage, such as ground (GND), which is developed on a reference supply node 107. A resistor divider 110 including a string or array (or even a matrix) of resistors is coupled between node 105 and GND. A first single-pole, single-throw (SPST) switch 112 has its switch terminals coupled between node 105 and another node 109, and a second SPST switch 114 has its switch terminals coupled between node 109 and GND. The SPST switches described herein may be implemented in any suitable manner, such as using transistors devices including MOS transistors or field-effect transistors or the like. A resistor 116 with resistance R is coupled between node 109 and a node 111 developing a voltage VT, and a capacitor 118 with capacitance C is coupled between node 111 and GND.

The oscillator 101 further includes a comparator 106 having a negative (or inverting) input coupled to a node 113 developing a reference voltage VREF, having a positive (or non-inverting) input coupled to node 111, and an output coupled to a node 115 developing a clock signal CLK. CLK is provided to an input of the switching logic 108, which has a set of control outputs controlling the switches 112 and 114 and a sigma-delta modulator 134. The sigma-delta modulator 134 controls a set of upper switches 120 to select a first intermediate node of the resistor divider 110 for developing an upper voltage VH and controls a set of lower switches 122 to select a second intermediate node of the resistor divider 110 for developing a lower voltage VL. The switching logic 108 selects one of VH or VL as the reference voltage VREF on node 113 provided to the comparator 106. The sigma-delta modulator 134 may adjust VH or VL over time to maintain a certain average frequency. Although not shown, the sigma-delta modulator 134 may input a digital word from a calibration circuit to calibrate the average frequency.

In general operation of the oscillator 101, the switching logic 108 opens the switch 114 and closes the switch 112 and selects the upper voltage VH as VREF. In this manner, the voltage VDD2 is applied across the series combination of the resistor 116 and the capacitor 118, which charges to increase the voltage VT. When VT reaches the voltage level of VREF, the comparator 106 toggles CLK high causing the switching logic 108 to close the switch 114 and open the switch 112 and to select the lower voltage VL as VREF. In this manner, the capacitor 118 is coupled in parallel with the resistor 116 so that it discharges to decrease the voltage VT. When VT falls to the voltage level of VREF, the comparator 106 toggles CLK low causing the switching logic 108 to re-open the switch 114 and close the switch 112 and to once again select the higher voltage VH as VREF. Operation repeats in this manner to develop the CLK signal having a frequency based on the voltage levels VDD3, VH, and VL, the resistance R and the capacitance C.

The waveform across the capacitor 118 approximates a triangular wave (of course with exponential rising/decaying shape) and the threshold settings at the comparator input are switched during consecutive cycles. The resistance R of the resistor 116 may be trimmed or the like and the capacitance C of the capacitor 118 may be calibrated or the like. Additional supporting circuitry may be included to achieve temperature independence in order to maintain stable frequency across an expected operating temperature range. In one embodiment, the oscillator 101 is designed to achieve a very high frequency stability interval at constant temperature. It is noted, however, that a transistor within the comparator 106 may be affected by random telegraph noise (RTN) causing a fluctuation in current or voltage over time so that the frequency of CLK is inconsistent as further described herein.

Figure 2:
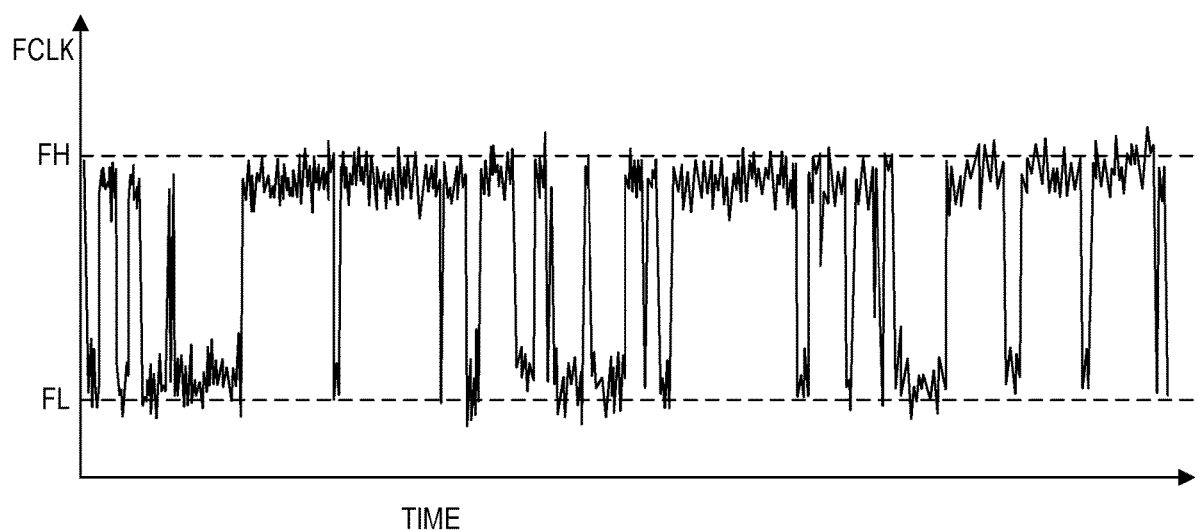
FIG. 2 is a timing diagram plotting a measurement of the average frequency of the CLK signal versus time when a transistor within the comparator of FIG. 1 is affected by RTN.

FIG. 2 is a timing diagram plotting a measurement of the average frequency of the CLK signal versus time when a transistor within the comparator 106 is affected by RTN. Although the frequency is intended to be very stable, instead the frequency instead jumps between two relatively discrete frequency levels FL and FH over time consistent with the well-known Lorentzian behavior because of RTN. Although the difference between FL and FH may be relatively small, this fluctuation in frequency may cause the oscillator 101 to fail a requisite frequency specification such as when used as an accurate timing reference. It may be possible to measure the actual frequency and detect the frequency error and possibly even the transistor affected with RST noise. However, when the time constant is on the order of milliseconds (ms) or even seconds, the test interval for detecting the frequency error may be prohibitively long for standard production test procedures. In other words, the practical production test time may not have sufficient duration to detect parts affected by RTN.

Figure 3:
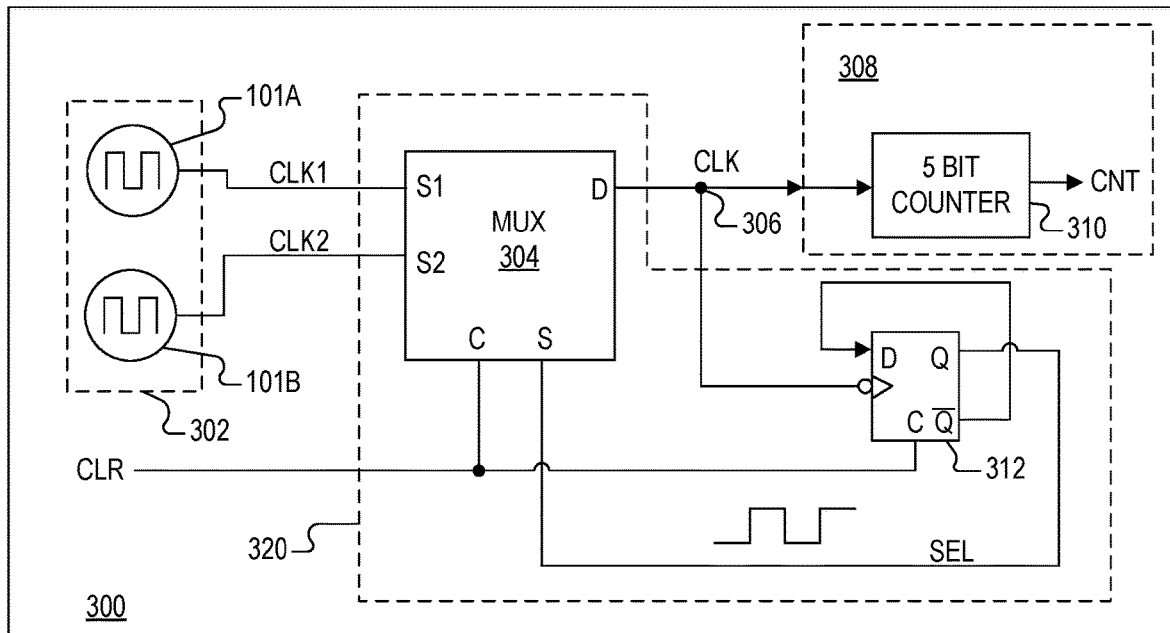
FIG. 3 is a simplified block diagram of an integrated circuit implemented with a system and method of duplicate circuit block swapping for noise reduction according to one embodiment in which an entire functional circuit is duplicated.

FIG. 3 is a simplified block diagram of a semiconductor chip or integrated circuit (IC) 300 implemented with a system and method of duplicate circuit block swapping for noise reduction according to one embodiment. Two duplicate oscillators 101A and 101B are integrated onto the IC 300 in close proximity with each other within a circuit area 302. The oscillators 101A and 101B are duplicates of each other and each may be configured according to the same or similar design as the oscillator 101. It has been observed during laboratory testing of duplicate circuit blocks integrated in close proximity with each other that there is a high probability that when one circuit block is affected with RTN, the remaining nearby circuit blocks are not affected with RTN. In other words, when there are a number N of duplicate blocks integrated onto a IC in close proximity to each other, in which N is any suitable integer number greater than one (e.g., 2, 3, 4, 8, 16, etc.), if one of the circuit blocks is affected with RTN, then chances are that the remaining circuit blocks are not. For purposes of illustration, it is assumed that oscillator 101A is affected with RTN whereas the oscillator 101B is not.

The oscillator 101A generates a first clock signal CLK1 and the oscillator 101B generates a second clock signal CLK2. CLK1 and CLK2 are provided to respective select terminals S1 and S2 of an analog multiplexer (MUX) 304. The MUX 304 has a D terminal coupled to a clock node 306 which is further coupled to remaining circuitry 308 integrated on the IC 300. The clock node 306 may more generally be referred to as a timing node. The MUX 304 operates to electrically couple one of the select terminals S1 and S2 to the D terminal depending upon its select input S. In the illustrated embodiment, the remaining circuitry 308 includes a 5-bit counter 310, in which CLK is provided to an input of the counter 310 and to the inverted clock input of a D-type flip-flop (DFF) 312. The MUX 304 provides a selected one of the clock signals CLK1 and CLK2 as the clock signal CLK to the DFF 312 and to the remaining circuitry 308 including the counter 310, and the counter 310 outputs a 5-bit count value CNT indicating the number of rising edges of CLK. The inverted output $\overline{Q}$ of the DFF 312 is fed back to its data input D, and the non-inverted output Q of the DFF 312 generates a select signal SEL which is provided to the select input S of the MUX 304 for coupling one of the terminals S1 or S2 to the D terminal. A clear signal CLR may be provided to clear inputs of the MUX 304 and the DFF 312. The MUX 304 and the DFF 312 collectively form a switch circuit 320 (also integrated on the IC 300) for swapping between the clock signals CLK1 and CLK2 for developing the clock signal CLK.

The remaining circuitry 308 of the IC 300 coupled to the clock node 306 for receiving the CLK signal may be as simple or as comprehensive as desired depending upon the overall functionality of the IC 300. For example, the remaining circuitry 308 may simply include the counter 310 along with any other supporting circuitry not shown or described. Alternatively, the remaining circuitry 308 may be significantly more complex, such as including processing circuitry, memory, input/output (I/O) circuitry, etc.

Figure 4:
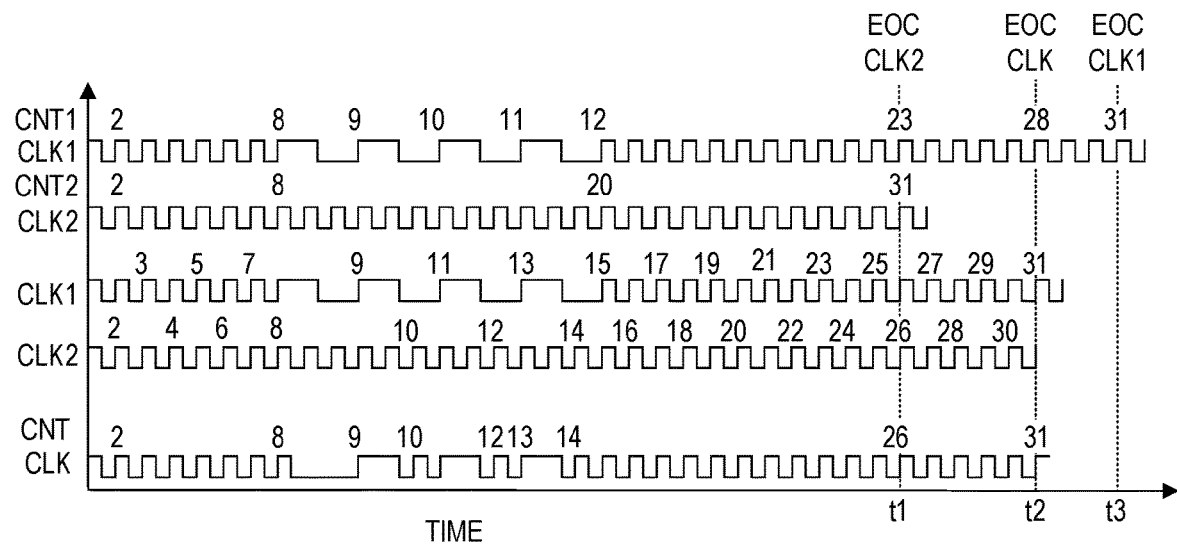
FIG. 4 is a timing diagram illustrating operation of the switch circuit of FIG. 3 that swaps between the clock signals CLK1 and CLK2 of the oscillators of FIG. 3, respectively, for developing a clock signal CLK with reduced noise.

FIG. 4 is a timing diagram illustrating operation of the switch circuit 320 that swaps between the clock signals CLK1 and CLK2 of the oscillators 101A and 101B, respectively, for developing the clock signal CLK with reduced noise. The timing diagram plots the clock signal CLK1 and CLK2 and corresponding count values CNT1 and CNT2 indicating the respective number of rising clock edges that would be counted by the counter 310 if counted independently. The timing diagram further repeats the CLK1 and CLK2 plots with alternating count values to show that edges of CLK1 are selected as odd counts and edges of CLK2 are selected as even counts because of operation of the switch circuit 320. The resulting clock signal output CLK is plotted along with its corresponding count by the counter 310.

The first 8 cycles of CNT1 and CNT2 track each other since they are duplicate circuits. It is assumed for purposes of illustration that the oscillators 101A and 101B are initially synchronized with each other, although additional circuitry (not shown) may be included for this purpose. The oscillator 101B is not affected by RTN so that its frequency does not change, so that if independently counted by the counter 310, it reaches an end of count (EOC) of 31 cycles at a first time t1. The oscillator 101A, however, is affected by RTN so that its frequency changes during the count process. Thus, when independently the clock cycles generated by the oscillator 101A are counted by the counter 310, the count value reaches 31 at a later time t3 which is significantly delayed as compared to time t1. As shown, cycles 8-11 of CLK1 are longer in duration because of RTN. The difference in EOC duration is substantially magnified to more clearly illustrate the frequency change. In an actual configuration, the frequency difference is relatively small and may be imperceptible to the naked eye. When the number of cycles is multiplied by a large amount, however, the difference between the duration to EOC becomes significant.

The switch circuit 320 operates by switching between the clock signals CLK1 and CLK2 of the oscillators 101A and 101B with each falling edge of CLK, so that the counter 310 counts only selected edges of the clock signals CLK1 and CLK2. The result is that the final EOC value of 31 for the clock signal CLK is reached more quickly at an intermediate time t2. Although time t2 is after time t1 so that an error still occurs, time t2 is before time t3 illustrating that the error has been reduced. The resulting output clock signal CLK and its corresponding count by the counter 310 is plotted last showing the final result.

It is noted that if neither of the oscillators 101A and 101B are affected by RTN, then the resulting error is negligible. Also, if both of the oscillators 101A and 101B are affected by RTN, then the resulting error still decreases because of the random nature of RTN. Based on actual laboratory measurements, however, it has been determined that there is a very high probability only one of multiple duplicate circuit blocks are affected by RTN when integrated in close proximity to each other even when N is relatively large, such as, for example, N=8. It has further been determined that for N duplicate circuit blocks in close proximity, if RTN follows statistics of a gaussian random process, then the error is expected to be reduced by an average factor of approximately $\sqrt{N}$, but that if RTN is not random but instead is deterministic, that the error may be reduced even further up to a factor of approximately N.

The implementation shown in FIG. 3 does not require any actual knowledge of the exact source of the RTN problem. Thus, there is no need to identify which particular transistor within the affected oscillator has RTN and thus causing the performance degradation. The implementation shown in FIG. 3, however, has several disadvantages when replicating the entire oscillator. For example, there is a 100% area and power penalty since the entire oscillator circuit block is replicated. In addition, additional implementation difficulties are encountered because in an actual configuration, the multiple oscillators are likely to be out of phase with each other so additional circuitry may be necessary.

Figure 5:
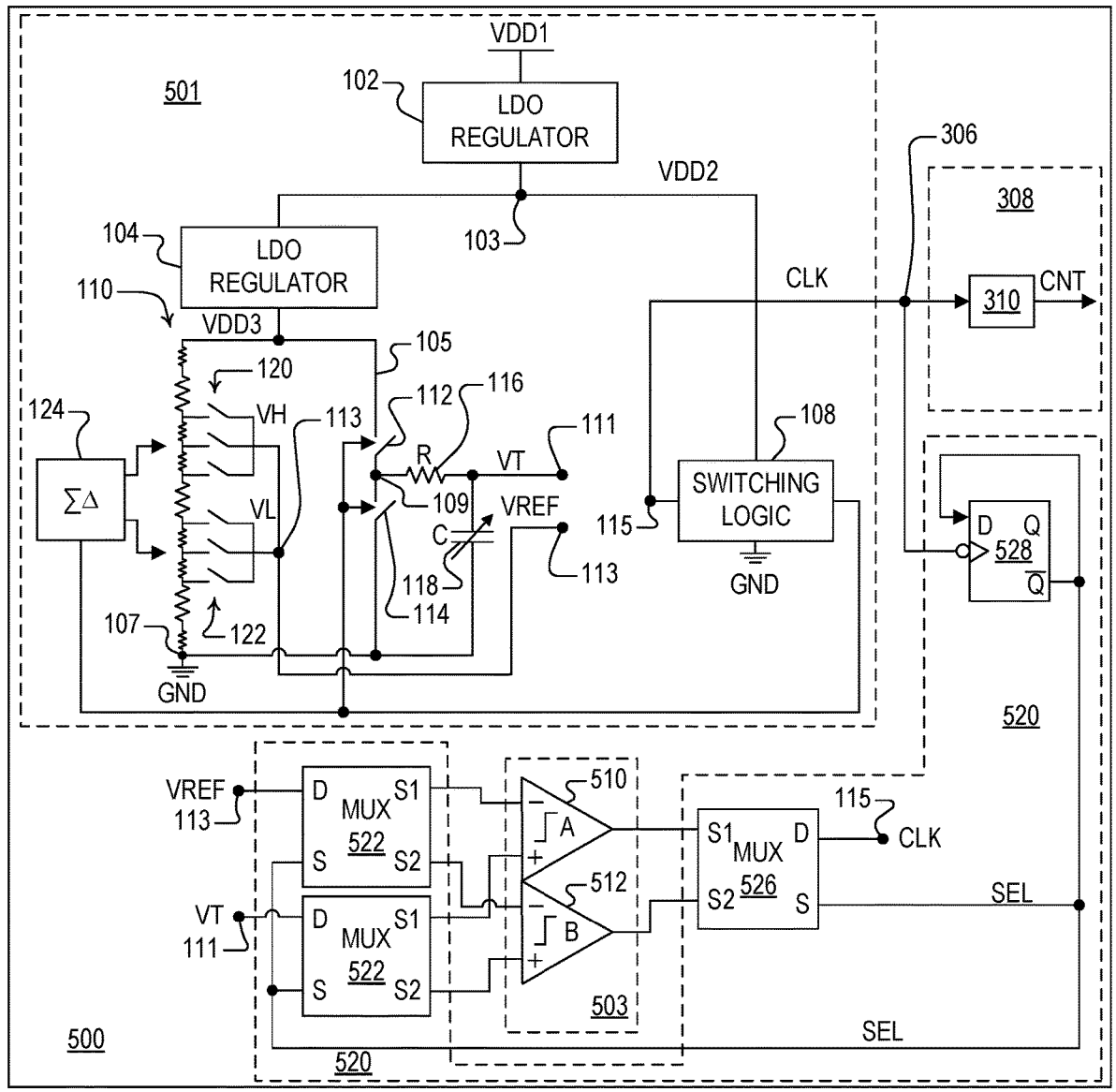
FIG. 5 is a simplified schematic and block diagram of another IC implemented with a system and method of duplicate circuit block swapping for noise reduction according to another embodiment in which a smaller portion of the functional circuit affected by RTN is duplicated and swapped.

FIG. 5 is a simplified schematic and block diagram of another IC 500 implemented with a system and method of duplicate circuit block swapping for noise reduction according to another embodiment. An oscillator 501 designed substantially the same as the oscillator 101 is integrated onto the IC 500, except that the comparator 106 shown in FIG. 1 is excluded. The remaining circuitry 308 with the counter 310 may be included to receive the clock signal CLK via the clock node 306 and to provide CNT. In a similar manner as described for the IC 300, the remaining circuitry 308 may be as simple or as complex as desired depending upon the overall functionality of the IC 500.

In this case, a pair of duplicate comparators 510 and 512 are integrated in close proximity to each other within a circuit area 503 of the IC 500. It is assumed for purposes of illustration that the comparator 510 (or comparator A) is affected by RTN and comparator 512 (or comparator B) is not. Node 113 (VREF) is coupled to the terminal D of a first analog MUX 522, node 111 (VT) is coupled to the D terminal of a second analog MUX 524, and node 115 (CLK) is coupled to the D terminal of a third analog MUX 526. Select terminal 51 of the first MUX 522 is coupled to the negative input of the first comparator 510, select terminal S2 of the first MUX 522 is coupled to the negative input of the second comparator 512, select terminal S2 of the second MUX 522 is coupled to the positive input of the first comparator 510, and select terminal S2 of the second MUX 524 is coupled to the positive input of the comparator 512. The output of the first comparator 510 is coupled to terminal 51 of the third MUX 526, and the output of the second comparator 512 is coupled to terminal S2 of the third MUX 526. The CLK signal is provided to the inverting clock input of a DFF 528, which has its inverting output $\overline{Q}$ providing a select signal which is fed back to its data input D and to the select inputs of the MUXes 522, 524, and 526. The analog MUXes 522, 524, and 526 operate in the same manner as described for the analog MUX 304.

The MUXes 522, 524, and 526 and the DFF 528 collectively form a switch circuit 520 for alternatively coupling one the comparators 510 and 512 (or comparators A and B, respectively) with each falling edge of CLK. When SEL is high, the comparator A is coupled into the oscillator 501 and comparator B is disconnected, and when SEL is low, comparator A is disconnected and comparator B is coupled into the oscillator 501. When a selected one of the comparators A and B is coupled into the oscillator 501, node 113 (VREF) is coupled to the negative input, node 111 (VT) is coupled to the positive input, and node 115 (CLK) is coupled to the output of the selected comparator. SEL is toggled to opposite states with each falling edge of CLK. In this manner, rather than duplicating and swapping the entire oscillator circuit block, only the comparator circuit block of the oscillator is duplicated and swapped in successive cycles of CLK.

Figure 6:
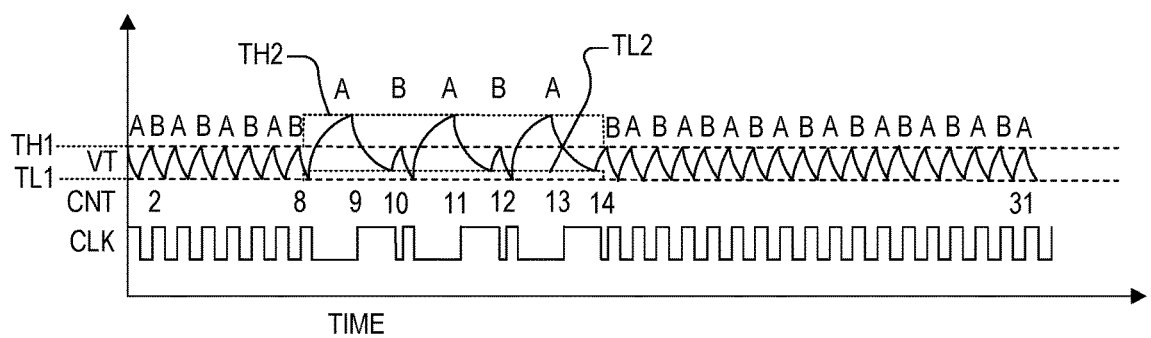
FIG. 6 is a timing diagram plotting signals of the IC of FIG. 5 versus time according to one embodiment.

FIG. 6 is a timing diagram plotting VT, CNT and CLK versus time according to one embodiment. When the RTN is not active, the VT signal charges and discharges between a first low threshold voltage TL1 and a first high threshold voltage TL2 for both comparators A and B when coupled. When RTN is active for the comparator A and comparator A is coupled to the oscillator 501, VT voltage charges and discharges between a second low threshold voltage TL2 and a second high threshold voltage TH2. The differences between the low thresholds TL1 and TL2 and between TH1 and TH2 are substantially magnified for purposes of illustration. The change in the low and high threshold voltages changes the timing of the VT voltage and thus modifies the frequency of CLK.

In the first 8 cycles of CLK, the comparators A and B are swapped with each other every negative edge of CLK for coupling to the oscillator 501. While the RTN is not active, VT charges and discharges between TL1 and TH1 so that operation of each of the comparators A and B is the same and the results are indistinguishable. In the falling edge of the 8$^{th}$ cycle of CLK when comparator A is selected, however, RTN becomes active so that VT charges to TH2 and then discharges to TL2. When VT reaches TL2, the CLK signal goes low so that comparator B is selected to be coupled. Thus in the 10$^{th}$ cycle, VT charges to TH1 and then discharges down to TL1. When VT reaches TL1, the CLK signal goes low so that comparator A is selected to be coupled for the 11$^{th}$ cycle. Since the RTN is still active in comparator A, VT charges up to TH2 and then discharges down to TL2 in the 11$^{th}$ cycle. Again, when VT reaches TL2, the CLK signal goes low so that the comparator B is selected to be coupled for the 12$^{th}$ cycle in which VT charges to TH1 and discharges down to TL1. Operation repeats in this manner for the 13$^{th}$ and 14$^{th}$ cycles. When VT discharges down to TL1 at the end of the 14$^{th}$ cycle, however, the RTN is no longer active so that when the comparator A is next selected for the 15$^{th}$ cycle, VT charges to TH1 and back down to TL1 according to normal operation. Operation continues in this manner while the RTN is not active for the remaining cycles up to the 31$^{st}$ cycle at the EOC.

As shown in FIG. 6, RTN does affect operation during a portion of the overall operation period. It is noted, however, that if the comparator A affected with RTN was used as the only comparator in the oscillator 501 instead of both oscillators A and B, then the level of error over an extended period of time becomes significantly larger just as is the case for the oscillator 101. The swapping of duplicate comparators A and B, however, substantially reduces the overall error for improved operation. The duplication and swapping of a comparator circuit block of a single oscillator provides several advantages over duplicating and swapping the entire oscillator circuit block. The area and power penalty is substantially reduced since large portions of the oscillator circuit, such as the LDO regulators 102 and 104, the sigma-delta modulator 124, the switching logic 108, etc., are not replicated. Also, the complications of phase error correction between multiple oscillators are avoided.

Figure 7:
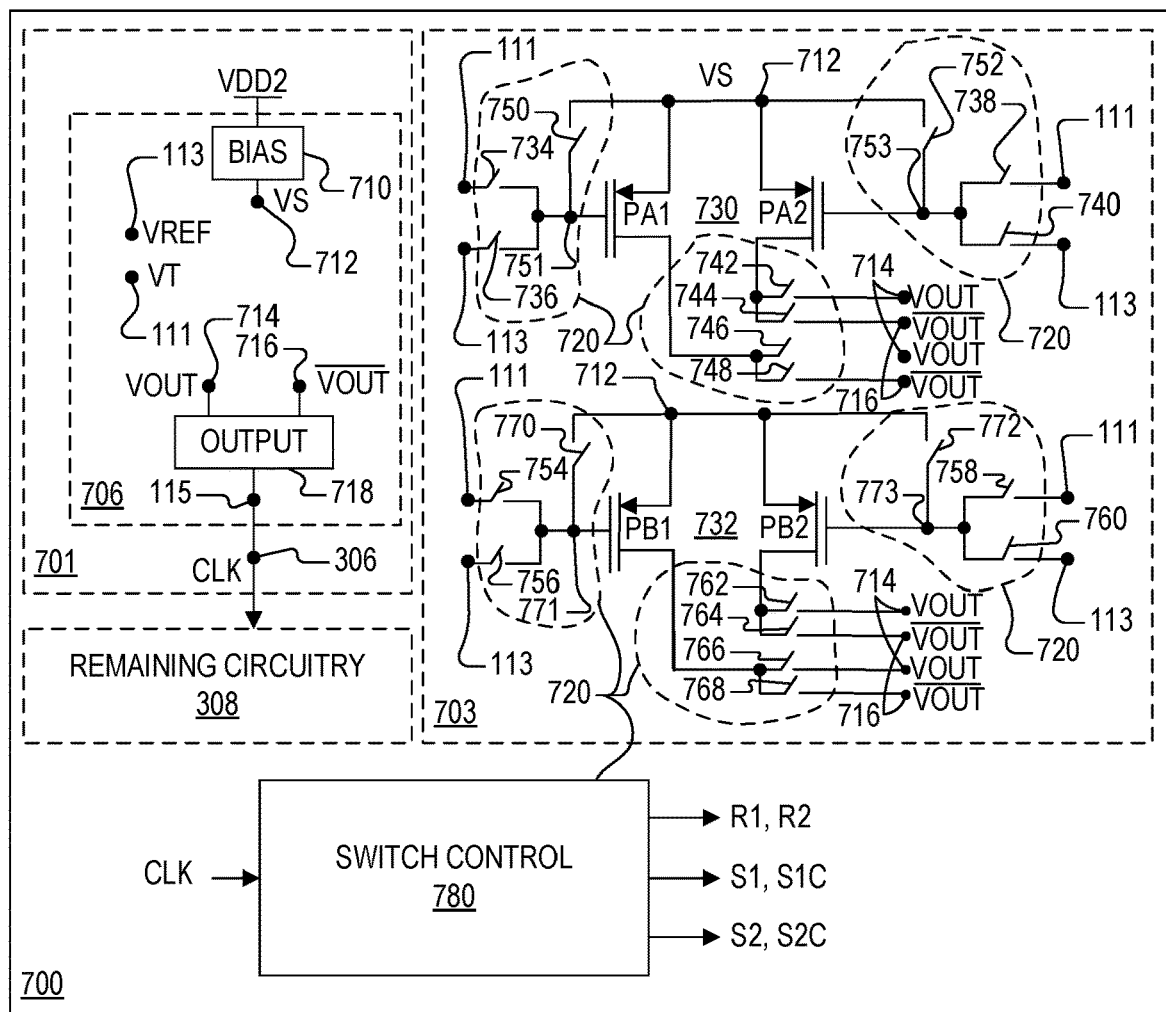
FIG. 7 is a simplified schematic and block diagram of yet another IC implemented with a system and method of duplicate circuit block swapping for noise reduction according to another embodiment in which an even smaller portion of the functional circuit affected by RTN is duplicated and swapped, such as, for example, a single transistor differential pair.

FIG. 7 is a simplified schematic and block diagram of yet another IC 700 implemented with a system and method of duplicate circuit block swapping for noise reduction according to another embodiment. An oscillator 701 designed substantially the same as the oscillator 101 is integrated onto the IC 700, and includes a portion of a comparator 706 that is substantially similar to the comparator 106 coupled to the nodes 111, 113 and 115. The comparator 706 includes a bias circuit 710 coupled between the supply voltage VDD2 and a source node 712. The comparator 706 further includes an output circuit 718 having a pair of inputs coupled to a pair of differential output nodes 714 and 716 developing internal differential output voltages VOUT and VOUT, respectively. The output circuit 718 has an output providing the CLK signal to the node 115, which is further coupled to the clock node 306. The remaining circuitry 308 is included and coupled to node 306 for receiving the CLK signal in a similar manner previously described. It is noted that since the entire oscillator 501 is not being switched out but instead just the oscillator comparator, that output node 115 may be electrically connected directly to the clock node 306.

In this case, a pair of duplicate transistor differential pairs 730 and 732 are integrated in close proximity to each other within a circuit area 703 of the IC 700. The differential pair 730 includes P-type MOS (PMOS) transistors PA1 and PA2 and the differential pair 732 includes PMOS transistors PB1 and PB2. If either one of the differential pairs 730 and 732 is affected by RTN, then there is a high probability that the other is not. More specifically, if any one of the transistors PA1, PA2, PB1 and PB2 is affected by RTN, then there is a high probability that the other transistors are not. As further described herein, a switch circuit 720 including a set of SPST switches and a switch control circuit 780 to control the switches is provided on the IC 700 to selectively insert one of the differential pairs 730 and 732 into the comparator 701 in successive cycles of CLK. Also, since the differential pairs 730 and 732 are symmetrical, the switch control circuit 780 controls the switches to perform "chopping" between the transistors of each differential pair as further described herein.

For the differential pair 730, PA1 has its source terminal coupled to the source node 712 and its gate terminal coupled to a node 751, and PA2 has its source terminal coupled to the source node 712 and its gate terminal coupled to a node 753. Furthermore, a switch 734 has its switched terminals coupled between node 111 and node 751, a switch 736 has its switched terminals coupled between node 113 and node 751, a switch 738 has its switched terminals coupled between node 111 and node 753, a switch 740 has its switched terminals coupled between node 113 and node 753, a switch 742 has its switched terminals coupled between the drain terminal of PA2 and node 714, a switch 744 has its switched terminals coupled between the drain terminal of PA2 and node 716, a switch 746 has its switched terminals coupled between the drain terminal of PA1 and node 714, a switch 748 has its switched terminals coupled between the drain terminal of PA1 and node 716, a switch 750 has its switched terminals coupled between nodes 712 and 751, and a switch 752 has its switched terminals coupled between nodes 712 and 753. The switches 734, 740, 742, and 748 are controlled by a control signal S1, the switches 736, 738, 744, and 746 are controlled by a control signal S1C, and the switches 750 and 752 are controlled by a control signal R1. The switch control circuit 780 generates the control signals R1, S1 and S1C based on the CLK signal.

For the differential pair 732, PB1 has its source terminal coupled to the source node 712 and its gate terminal coupled to a node 771, and PB2 has its source terminal coupled to the source node 712 and its gate terminal coupled to a node 773. Furthermore, a switch 754 has its switched terminals coupled between node 111 and node 771, a switch 756 has its switched terminals coupled between node 113 and node 771, a switch 758 has its switched terminals coupled between node 111 and node 773, a switch 760 has its switched terminals coupled between node 113 and node 773, a switch 762 has its switched terminals coupled between the drain terminal of PB2 and node 714, a switch 764 has its switched terminals coupled between the drain terminal of PB2 and node 716, a switch 766 has its switched terminals coupled between the drain terminal of PB1 and node 714, a switch 768 has its switched terminals coupled between the drain terminal of PB1 and node 716, a switch 770 has its switched terminals coupled between nodes 712 and 771, and a switch 772 has its switched terminals coupled between nodes 712 and 773. The switches 754, 760, 762 and 768 are controlled by a control signal S2, the switches 756, 758, 764 and 766 are controlled by a control signal S2C, and the switches 770 and 772 are controlled by a control signal R2. The switch control circuit 780 also generates the control signals R2, S2 and S2C based on the CLK signal.

Figure 8:
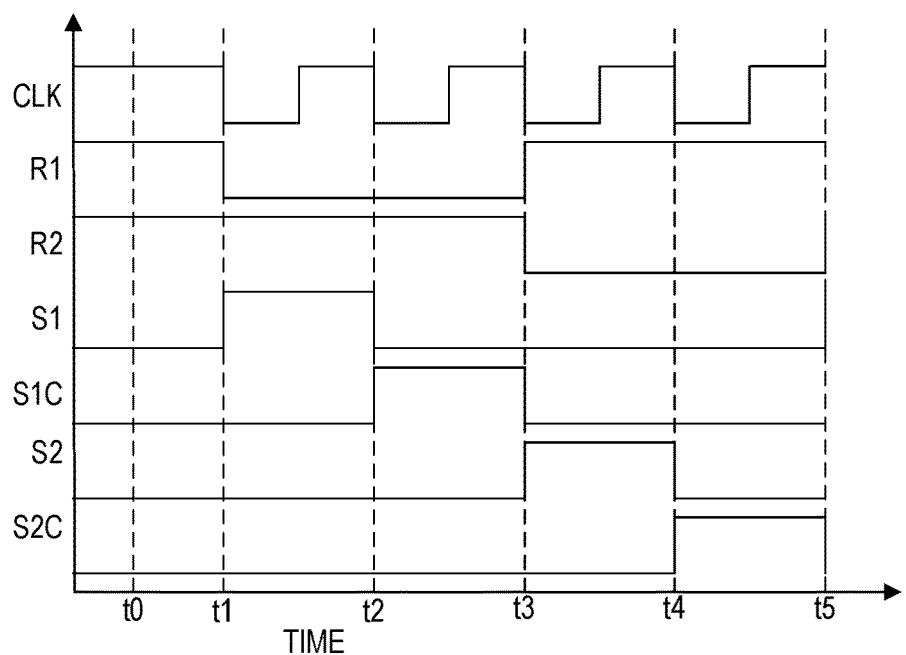
FIG. 8 is a timing diagram plotting the clock and the control signals versus time illustrating operation of the switch control circuit of FIG. 7 for controlling the switches of the corresponding switch circuit according to one embodiment.

FIG. 8 is a timing diagram plotting CLK and the control signals R1, R2, S1, S1C, S2 and S2C versus time illustrating operation of the switch control circuit 780 for controlling the switches of the switch circuit 720 according to one embodiment. At an initial or preliminary time t0, the system may be in reset in which both R1 and R2 are asserted high. When the control signal R1 is asserted high, the switches 750 and 752 are closed so that the gate and source terminals of the transistors PA1 and PA2 of the differential pair 730 are shorted together. Also, when the control signal R2 is asserted high, the switches 770 and 772 are closed so that the gate and source terminals of the transistors PB1 and PB2 of the differential pair 732 are shorted together. The control signals S1, S1C, S2 and S2C are low so that both of the differential pairs 730 and 732 are removed from the circuit so that the comparator 701 is inoperative during the reset state.

CLK and R1 both go low at a subsequent time t1 while S1 is asserted high. R1 pulls the differential pair 730 out of reset mode and S1 couples the differential pair 730 into the comparator 701. In particular, the switches 750 and 752 are opened and the switches 734, 740, 742, and 748 are closed so that the gate terminal of PA1 is coupled to node 111 for receiving VT, the drain terminal of PA1 is coupled to node 716 for developing the negative output signal $\overline{VOUT}$, the gate terminal of PA2 is coupled to node 113 for receiving VREF, and the drain terminal of PA2 is coupled to node 714 for developing the positive output signal VOUT. Also when CLK goes low, VREF is increased to VH and the switch 112 is closed so that the capacitor 118 charges to increase VT. When VT rises to VREF, CLK is asserted high, VREF is decreased to VL and the capacitor 118 discharges to decrease VT.

When VT falls to VREF at subsequent time t2, CLK and Si are both asserted low while S1C is asserted high so that the differential pair 730 remains coupled but is chopped so that the transistors PA1 and PA2 are swapped. In particular, while the switches 750 and 752 remain open, the switches 736, 738, 744, and 746 are closed so that the gate terminal of PA1 is coupled to node 113 for receiving VREF, the drain terminal of PA1 is coupled to node 714 for developing the positive output signal VOUT, the gate terminal of PA2 is coupled to node 111 for receiving VT, and the drain terminal of PA2 is coupled to node 716 for developing the negative output signal $\overline{VOUT}$. In effect, the transistors PA1 and PA2 are swapped with each other for the next CLK cycle. The cycle is substantially repeated, in which VREF is increased to VH and the capacitor 118 charges to increase VT. When VT rises to VREF, CLK goes high, VREF is decreased to VL and the capacitor discharges to decrease VT.

When VT falls to VREF at subsequent time t3, R1 is asserted high to place the differential pair 730 in reset mode while R2 is asserted low to pull the differential pair 732 out of its reset mode. Also, S1C is pulled low to de-couple the differential pair 730 and S2 is asserted high to couple the differential pair 732 into the comparator 701. In particular, the switches 754, 760, 762, and 768 are closed so that the gate terminal of PB1 is coupled to node 111 for receiving VT, the drain terminal of PB1 is coupled to node 716 for developing the negative output signal $\overline{VOUT}$, the gate terminal of PB2 is coupled to node 113 for receiving VREF, and the drain terminal of PB2 is coupled to node 714 for developing the positive output signal VOUT. VREF is again increased to VH and the capacitor 118 charges to increase VT. When VT rises to VREF, CLK is asserted high, VREF is decreased to VL and the capacitor 118 discharges to decrease VT.

When VT falls to VREF at subsequent time t4, CLK and S2 are both asserted low while S2C is asserted high so that the differential pair 732 remains coupled but is chopped. In particular, while the switches 770 and 772 remain open, the switches 756, 758, 764, and 766 are closed so that the gate terminal of PB1 is coupled to node 113 for receiving VREF, the drain terminal of PB1 is coupled to node 714 for developing the positive output signal VOUT, the gate terminal of PB2 is coupled to node 111 for receiving VT, and the drain terminal of PB2 is coupled to node 716 for developing the negative output signal $\overline{VOUT}$. In effect, the transistors PB1 and PB2 are swapped with each other for the next CLK cycle. The cycle is substantially repeated, in which VREF is increased to VH and the capacitor 118 charges to increase VT. When VT rises to VREF, CLK goes high, VREF is decreased to VL and the capacitor discharges to decrease VT.

When VT falls to VREF at subsequent time t5, the entire process is repeated in which the differential pair 730 is once again coupled back into the comparator 701 to repeat a normal cycle and a chopped cycle for 2 CLK cycles, and then the differential pair 732 is again coupled back into the comparator 701 to repeat a normal cycle and a chopped cycle for 2 more CLK cycles. The swapping of duplicate differential transistor pair circuit blocks reduces the overall error for improved operation in a similar manner as swapping the entire comparator block circuit. The duplication and swapping of a differential transistor pair of a comparator circuit block provides several advantages over duplicating and swapping the entire comparator circuit block. The area and power penalty is significantly reduced since significant portions of the comparator circuit, such as the bias circuit 710, the output circuit 718, etc., need not be replicated.

In addition to swapping duplicate circuit blocks, the process of "chopping" may be performed on each circuit block while coupled to reduce noise even further. A circuit block is applicable for chopping when in a symmetrical configuration and when voltage offsets caused by many factors including RTN exist, such as, for example, a differential transistor pair. Chopping includes reversing or swapping connection of devices in the circuit block to cancel out some of the offset to attenuate noise that is well below the frequency of chopping. Chopping may be applicable to other circuit blocks such as the entire oscillator or even the comparator of the oscillator although circuit area and power penalties apply.

Figure 9:
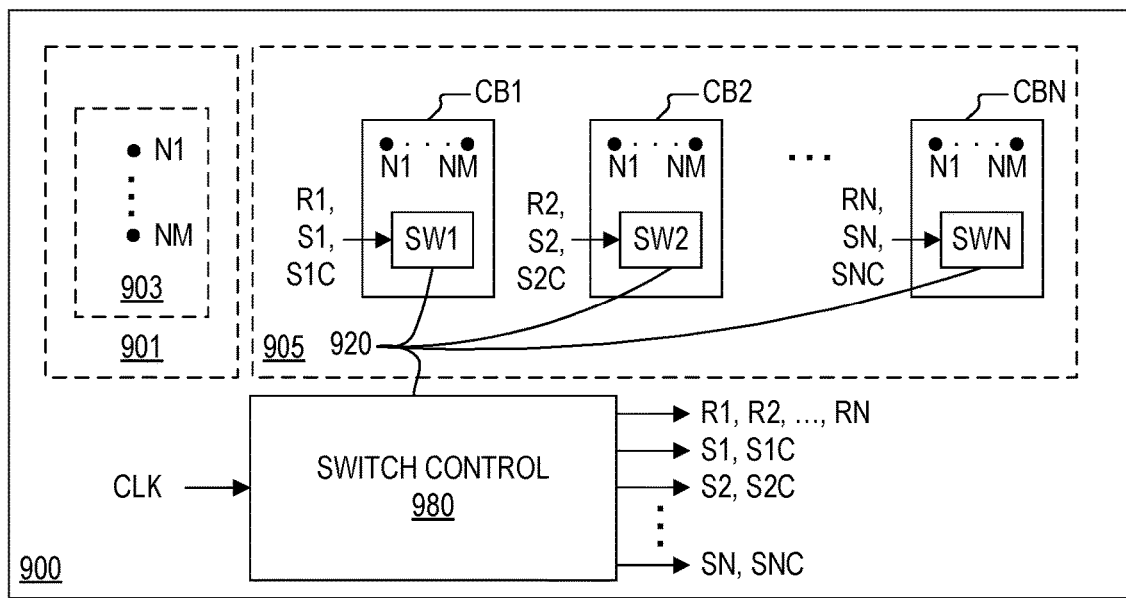
FIG. 9 is a simplified block diagram of yet another IC implemented with a system and method of duplicate circuit block swapping for noise reduction according to a more generalized configuration and for any number N of duplicate circuit blocks.

Although only two differential pairs are shown for swapping and chopping, any number N of differential pairs may be included with additional switching circuitry for swapping and chopping. As shown in FIG. 9, for example, an IC 900 includes a functional circuit 901 (e.g., audio circuit, oscillator, comparator, etc.) which further includes a sub-circuit 903 including or otherwise coupled to one or more nodes, such as a number M of nodes N1, . . . , NM, in which M is at least 1. A circuit area 905 includes N duplicate circuit blocks CB1, CB2, . . . , CBN, each including or otherwise configured to couple to the M nodes of the sub-circuit 903 to complete the sub-circuit 903. A switch control circuit 980 is included for providing select control signals S1, S2, . . . , SN, and for further providing reset control signals R1, R2, . . . , RN (if necessary or desired), and chop select signals S1C, S2C, . . . , SNC (if desired). The reset control signals R1-RN are provided if it is desired to place non-coupled ones of the circuit blocks CB1-CBN in a reset mode. The chop select signals S1C-SNC are provided if the circuit blocks CB1-CBN are symmetrical (e.g., differential transistor pair) and if chopping is desired.

The IC 900 includes a switch circuit 920, which includes the switch control circuit 980 and a set of N switching circuits SW1, SW2, . . . , SWN. The switching circuits SW1-SWN may be implemented with any type of switching devices or combinations thereof, such as including analog multiplexers, SPST switches, etc. The switching circuits SW1-SWN receive corresponding control signals from the switch control circuit 980 for coupling a corresponding one of the circuit blocks CB1-CBN to the sub-circuit 903 of the functional circuit 901. As shown, for example, control signals R1, S1, and S1C are provided to the switching circuit SW1 for controlling the coupling of the circuit block CB1, control signals R2, S2, and S2C are provided to the switching circuit SW2 for controlling the coupling of the circuit block CB2, and so on up to control signals RN, SN, and SNC which are provided to the switching circuit SW1 for controlling the coupling of the circuit block CBN.

Figure 10:
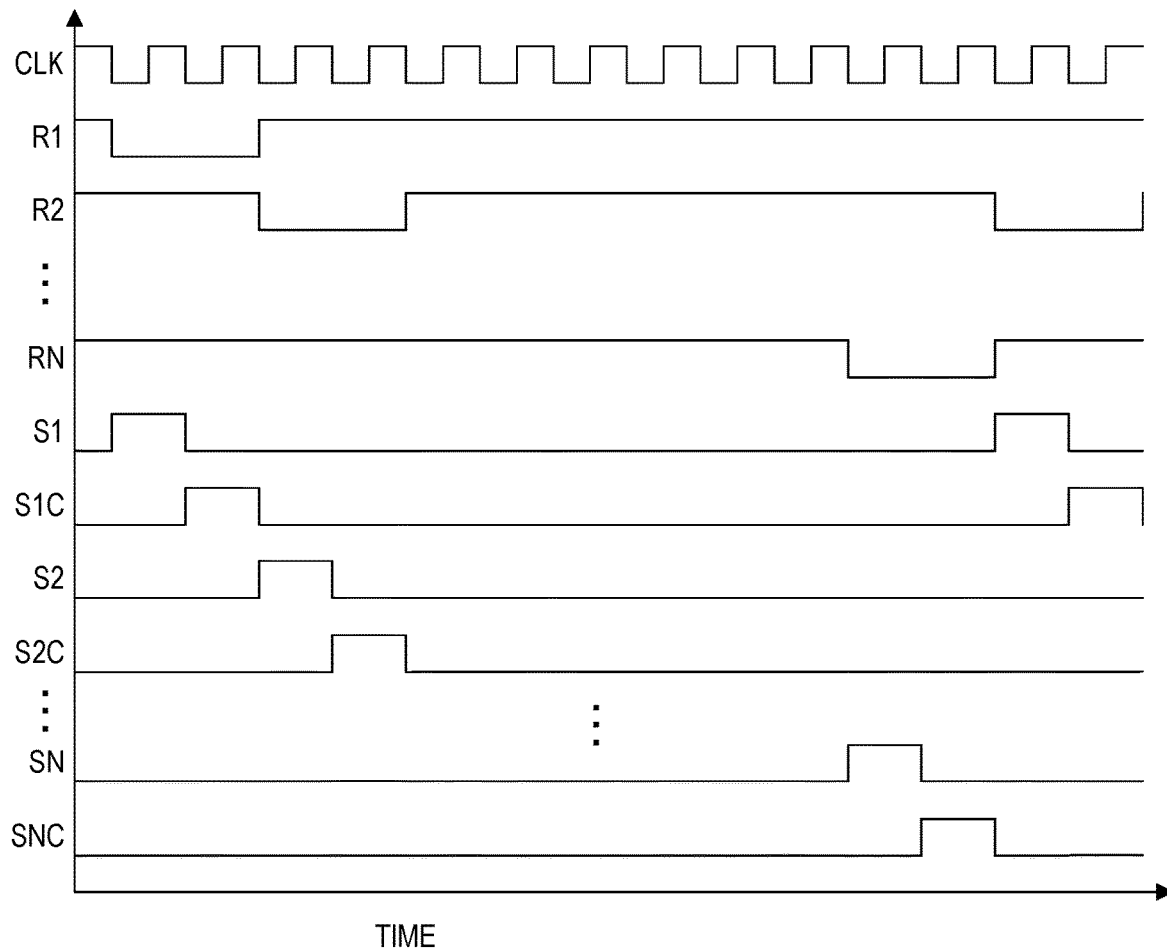
FIG. 10 is a timing diagram plotting clock and control signals versus time illustrating operation of the switch control circuit of FIG. 9 for controlling the switches of the corresponding switch circuit according to one embodiment.

FIG. 10 is a timing diagram plotting CLK and the control signals R1-RN, S1-SN and S1C-SNC versus time illustrating operation of the switch control circuit 980 for controlling the switches of the switch circuit 920 according to one embodiment. Operation is similar to that of FIG. 8 except extended to N circuit blocks CB1-CBN. R1 (if reset is included) goes low to pull CB1 out of reset, and Si goes low for at least one cycle of CLK to couple the M nodes of CB1 into the M nodes of the sub-circuit 903 during that clock cycle. If chopping is applicable and desired, S1 is pulled low and S1C is asserted high while R1 remains low for at least one more cycle of CLK to again couple the M nodes of CB1 into the M nodes of the sub-circuit 903 in reverse or swapped order according to chop operation. Then R2 goes low to pull CB2 out of reset, and S2 and S2C are asserted in sequential CLK cycles as shown to couple the M nodes of CB2 into the M nodes of the sub-circuit 903 during the next CLK clock cycles. Operation continues in this manner up to RN, which goes low to pull CBN out of reset, and SN and SNC are asserted in sequential CLK cycles as shown to couple the M nodes of CBN into the M nodes of the sub-circuit 903 during the next CLK clock cycles. After each of the N circuit blocks CB1-CBN are coupled in this manner, operation repeats in which R1 is again asserted for coupling CB1 once again.

The inclusion and swapping of N duplicate circuit blocks integrated in close proximity to each other further reduces the overall error for improved operation. The swapping (or substitution) of 2 duplicate circuit blocks in proximity as shown in FIGS. 3 (entire oscillator), 5 (oscillator comparator) and 7 (comparator differential pair) reduces error by a factor of at least $\sqrt{2}$ and possibly by a factor of up to 2. When N is greater than 2, such as, for example, N=8, then swapping may reduce error cause by RTN by a factor of at least $\sqrt{8}$ (if RTN follows statistics of a gaussian random process) up to a factor of 8 (if RTN is deterministic). It is noted that when RTN follows statistics of a gaussian random process, more than one even up to all of the duplicate circuit blocks may be affected by RTN even if less likely. Even so, because of the random nature of RTN, circuit block swapping still reduces overall noise and error because of the random statistical distribution of the noise. In particular, swapping between N duplicate circuit blocks tends to cancel out at least a portion of the noise thereby attenuating overall noise resulting in an average reduction factor of $\sqrt{N}$. Statistically speaking, even when N is large, such as 8, the more likely condition is that only one of the duplicate circuit blocks is affected by RTN so that the reduction factor may be as high as 8.

Although N may be as large as physically feasible or possible, the tradeoff is that increasing the value of N increases the number of duplicate circuits and increases the size of the switch circuit including corresponding switches and a switch controller or the like. The size of the duplicate circuit may be limited to only those devices that are susceptible to RTN and that also impact overall circuit operation (e.g., timing).

Although the present invention has been illustrating in the present disclosure using clock circuits or those circuits used for purposes of timing, the present invention is applicable to other types of circuits in which RTN may be a factor affecting overall performance. RTS affecting an amplifier in an audio circuit, for example, may cause an increase in undesired low frequency noise. The circuit that is susceptible to RTN may be duplicated and swapped in accordance with that described herein to reduce noise and improve performance.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. An integrated circuit, comprising:
   at least one circuit node;
   a plurality of duplicate circuit blocks integrated on the integrated circuit in close proximity with each other, each comprising at least one device that is susceptible to random telegraph noise (RTN); and a switch circuit that swaps electrical coupling of said plurality of duplicate circuit blocks, one at a time, to said at least one circuit node in sequential cycles of a clock signal.

2. The integrated circuit of claim 1, wherein:

said at least one circuit node comprises a timing node;

wherein said plurality of duplicate circuit blocks comprise a plurality of duplicate oscillators providing a corresponding plurality of timing signals; and wherein said switch circuit electrically couples each of said plurality of timing signals, one at a time, to said timing node.

3. The integrated circuit of claim 1, wherein:

said at least one circuit node comprises a positive input node, a negative input node, and an output node;

wherein said plurality of duplicate circuit blocks comprises a plurality of comparators each having a positive comparator input, a negative comparator input, and a comparator output; and wherein said switch circuit electrically couples said plurality of comparators, one at a time, to said at least one circuit node, and wherein when a selected comparator is electrically coupled, said switch circuit electrically couples said positive comparator input of said selected comparator to said positive input node, electrically couples said negative comparator input of said selected comparator to said negative input node, and electrically couples said comparator output of said selected comparator to said output node.

4. The integrated circuit of claim 1, wherein:

said at least one circuit node comprises a positive input node, a negative input node, a positive output node, and a negative output node;

wherein said plurality of duplicate circuit blocks comprises a plurality of differential pairs each having a first input, a second input, a first output, and a second output; and wherein said switch circuit electrically couples said plurality of differential pairs, one at a time, to said at least one circuit node, and wherein when a selected differential pair is electrically coupled, said switch circuit electrically couples said first input of said selected differential pair to said positive input node, electrically couples said second input of said selected differential pair to said negative input node, electrically couples said first output of said selected differential pair to said negative output node, and electrically couples said second output of said selected differential pair to said positive output node.

5. The integrated circuit of claim 4, wherein:

each of said plurality of differential pairs further comprises a common source node; and wherein for each of said plurality of differential pairs that is not selected to be electrically coupled to said at least one circuit node, said switch circuit asserts a reset signal to electrically couple said first and second inputs of each non-selected differential pair to a common source node of each said non-selected differential pair.

6. The integrated circuit of claim 1, wherein:

said at least one circuit node comprises a positive input node, a negative input node, a positive output node, and a negative output node;

wherein said plurality of duplicate circuit blocks comprises a plurality of differential pairs each having a first input, a second input, a first output, and a second output; and wherein said switch circuit electrically couples said plurality of differential pairs, one at a time, to said at least one circuit node, and wherein when a selected differential pair is electrically coupled, said switch circuit further performs chopping in two clock cycles comprising:

a first clock cycle in which said switch circuit electrically couples said first input of said selected differential pair to said positive input node, electrically couples said second input of said selected differential pair to said negative input node, electrically couples said first output of said selected differential pair to said negative output node, and electrically couples said second output of said selected differential pair to said positive output node; and a second clock cycle in which said switch circuit electrically couples said first input of said selected differential pair to said negative input node, electrically couples said second input of said selected differential pair to said positive input node, electrically couples said first output of said selected differential pair to said positive output node, and electrically couples said second output of said selected differential pair to said negative output node.

7. The integrated circuit of claim 1, wherein:

said at least one circuit node comprises a plurality of circuit nodes;

wherein each of said plurality of duplicate circuit blocks comprises a plurality of block nodes; and wherein when a circuit block is selected to be electrically coupled, said switch circuit electrically couples each of said plurality of block nodes of said selected circuit block to a corresponding one of said plurality of circuit nodes.

8. The integrated circuit of claim 1, wherein each of said plurality of duplicate circuit blocks operates with a time constant on the order of at least one millisecond.

9. The integrated circuit of claim 1, wherein said at least one circuit node is part of a clock circuit that is used to generate a time reference.

10. The integrated circuit of claim 1, wherein:

at least one circuit node comprises first and second input nodes and first and second output nodes;

wherein said plurality of duplicate circuit blocks comprise symmetrical circuits with first and second input terminals and first and second output terminals such that when electrically coupled, said first and second input terminals are coupled to said first and second input nodes, and said first and second output terminals are coupled to said first and second output nodes; and wherein said switch circuit also performs chopping by swapping coupling of said first and second input terminals and said first and second output terminals.

11. A method of reducing noise on a semiconductor circuit, comprising:

providing at least one circuit node on the semiconductor circuit;

integrating a plurality of duplicate circuit blocks on the semiconductor circuit in close proximity with each other, each comprising at least one device that is susceptible to random telegraph noise (RTN); and swapping electrical coupling of the plurality of duplicate circuit blocks, one at a time, to the at least one circuit node in sequential cycles of a clock signal.

12. The method of claim 11, wherein:
said providing at least one circuit node comprises providing a timing node;
wherein said integrating a plurality of duplicate circuit blocks comprises integrating a plurality of duplicate oscillators providing a corresponding plurality of timing signals; and
wherein said swapping comprises electrically coupling each of the plurality of timing signals, one at a time, to the timing node.

13. The method of claim 11, wherein:
said providing at least one circuit node comprises providing a positive input node, a negative input node, and an output node;
wherein said integrating a plurality of duplicate circuit blocks comprises integrating a plurality of comparators each having a positive comparator input, a negative comparator input, and a comparator output; and
wherein said swapping comprises electrically coupling the plurality of comparators, one at a time, to the at least one circuit node, and wherein when a selected comparator is electrically coupled, said swapping comprises electrically coupling the positive comparator input of the selected comparator to the positive input node, electrically coupling the negative comparator input of the selected comparator to the negative input node, and electrically coupling the comparator output of the selected comparator to the output node.

14. The method of claim 11, wherein:
said providing at least one circuit node comprises providing a positive input node, a negative input node, and positive output node, and a negative output node;
wherein said integrating a plurality of duplicate circuit blocks comprises integrating a plurality of differential pairs each having a first input, a second input, a first output, and a second output; and
wherein said swapping comprises electrically coupling the plurality of differential pairs, one at a time, to the at least one circuit node, and wherein when a selected differential pair is electrically coupled, said swapping comprises electrically coupling the first input of the selected differential pair to the positive input node, electrically coupling the second input of the selected differential pair to the negative input node, electrically coupling the first output of the selected differential pair to the negative output node, and electrically coupling the second output of the selected differential pair to the positive output node.

15. The method of claim 14, wherein:
said integrating a plurality of duplicate circuit blocks includes integrating a common source node with each of said plurality of duplicate circuit blocks; and
asserting a reset signal to electrically couple the first and second inputs of each non-selected differential pair to a common source node of each non-selected differential pair.

16. The method of claim 11, wherein:
said providing at least one circuit node comprises providing a positive input node, a negative input node, and positive output node, and a negative output node;
wherein said integrating a plurality of duplicate circuit blocks comprises integrating a plurality of differential pairs each having a first input, a second input, a first output, and a second output; and
wherein said swapping comprises electrically coupling the plurality of differential pairs, one at a time, to the at least one circuit node, and wherein when a selected differential pair is electrically coupled, further comprising performing chopping in two clock cycles comprising:
   a first clock cycle comprising electrically coupling the first input of the selected differential pair to the positive input node, electrically coupling the second input of the selected differential pair to the negative input node, electrically coupling the first output of the selected differential pair to the negative output node, and electrically coupling the second output of the selected differential pair to the positive output node; and
   a second clock cycle comprising electrically coupling the first input of the selected differential pair to the negative input node, electrically coupling the second input of the selected differential pair to the positive input node, electrically coupling the first output of the selected differential pair to the positive output node, and electrically coupling the second output of the selected differential pair to said negative output node.

17. The method of claim 11, wherein:
said providing at least one circuit node comprises providing a plurality of circuit nodes;
wherein said integrating a plurality of duplicate circuit blocks comprises integrating a plurality of block nodes; and
wherein when a circuit block is selected to be electrically coupled, said swapping comprises electrically coupling each of the plurality of block nodes of the selected circuit block to a corresponding one of the plurality of circuit nodes.

18. The method of claim 11, wherein said integrating a plurality of duplicate circuit blocks comprises configuring each of the plurality of duplicate circuit blocks to operate with a time constant on the order of at least one millisecond.

19. The method of claim 11, wherein said providing at least one circuit node comprises configuring the at least one circuit node to generate a time reference.

20. The method of claim 11, wherein:
said providing at least one circuit node comprises providing first and second input nodes and first and second output nodes;
wherein said integrating a plurality of duplicate circuit blocks comprises providing symmetrical circuits with first and second input terminals and first and second output terminals such that when electrically coupled, the first and second input terminals are coupled to the first and second input nodes, and the first and second output terminals are coupled to the first and second output nodes; and
wherein said swapping further includes chopping by swapping coupling of the first and second input terminals and the first and second output terminals.

* * * * *